Dec. 8, 1970
D. H. WESTWOOD
3,546,617
DIGITAL FREQUENCY SYNTHESIZER
Filed Nov. 26, 1968
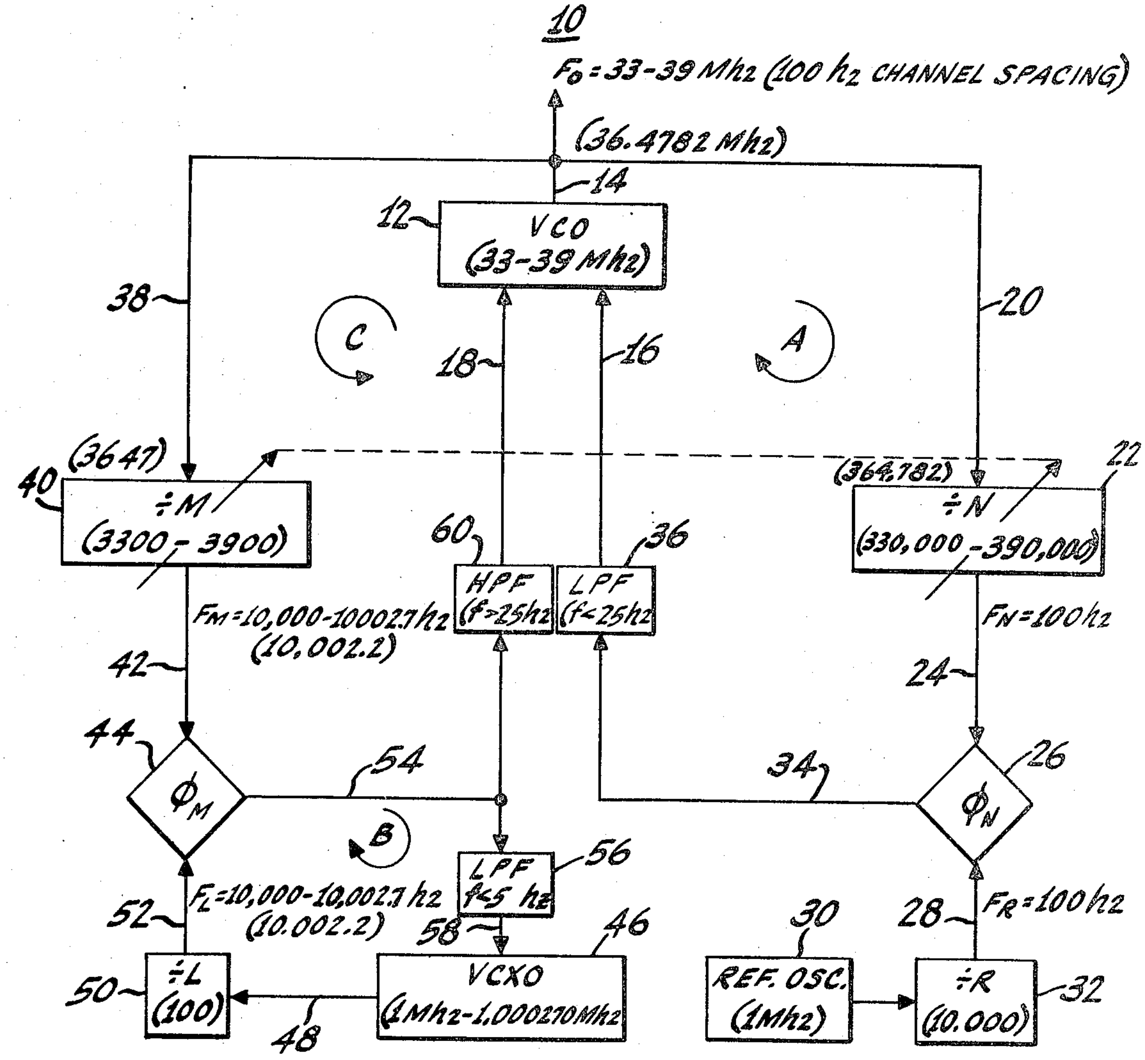
INVENTOR
DAVID H. WESTWOOD
BY Edward J. Norton
ATTORNEY 3,546,617

DIGITAL FREQUENCY SYNTHESIZER

David H. Westwood, Cherry Hill, N.J., assignor to RCA Corporation, a corporation of Delaware Filed Nov. 26, 1968, Ser. No. 779,080
Int. Cl. H03b 3/04
U.S. Cl. 331—2 10 Claims

ABSTRACT OF THE DISCLOSURE

In a frequency synthesizer having three phase locked loops, the output of the voltage controlled oscillator (VCO) is corrected at a rate greater than the channel spacing of the synthesizer. The first loop determines the VCO frequency and corrects the VCO at the channel spacing frequency rate. The second and third loops operate together to correct the VCO at a much greater rate; the second loop doing the correcting; and, the third loop providing the second loop with a variable reference frequency that is a submultiple of the VCO frequency.

This invention relates to indirect frequency synthesis and more particularly to an improved digital frequency synthesizer in which a highly stable output signal is achieved, with closely spaced channels.

State-of-the-art digital frequency synthesizers have a voltage controlled oscillator (VCO), a variable frequency dividing network and a phase comparing network. The frequency of the VCO is divided by the dividing network and this divided frequency is compared with a reference frequency in the phase comparing circuit. When the two compared frequencies are not the same because, for instance, the VCO frequency has changed due for instance to an unintentional drift in the VCO control voltage, the output voltage of the phase comparing circuit is correspondingly changed and applied through a low pass filter to become a corrected new VCO control voltage. The corrected voltage returns the VCO frequency back to the desired frequency. When there is no difference between the divided frequency and the reference frequency, the VCO is phase locked at a stable frequency. If a different stable VCO frequency is desired, the divisor of the variable frequency dividing network is changed, causing a momentary change in the divided frequency. Thereafter, a new voltage is applied to the VCO from the phase comparing circuit and this produces a new VCO frequency. This procedure continues until the new divided frequency signal equals the reference frequency. At this time the synthesizer is phase locked on the new stable frequency.

In the synthesizer just described, the phase comparing circuit can be designed to correct the VCO frequency at a frequency rate which is the channel spacing or any submultiple thereof, where the channel spacing is defined as the frequency difference between successive stable frequencies of the VCO. For instance, high frequency (HF) radios in the 2 mHz. to 30 mHz. range often require pump frequencies in the range of 33 mHz. to 39 mHz. and it is often desirable to generate channels separated by only 100 Hz. Thus, at 33 mHz. the maximum correction rate of the VCO is 100 Hz. or once in every 330,000 cycles of the output signal. Because of this extremely low correction rate, the output signal of the VCO will exhibit poor short term stability or spectral purity. Furthermore, it is very likely that considerable incidental FM will occur in the VCO signal due to this slow correction rate.

In view of these problems, it has been necessary in the past to employ multicrystal oscillators with complicated mixing, filtering, and frequency dividing techniques to achieve long term frequency accuracy with good short term spectral purity in a frequency synthesizer with closely spaced channels. Such systems are very bulky and expensive and have limited use in many applications where frequency synthesis in general would be desirable.

It is therefore the object of this invention to provide an improved frequency synthesizer.

Accordingly, a frequency synthesizer having two phase locked loops around the same controlled oscillator is provided. In the first loop the control signal of the oscillator is corrected at a rate which is the same as or a submultiple of the channel spacing frequency and this loop is used to select the channel at which the synthesizer operates. In the second loop, a control signal correction rate considerably higher than the channel spacing is used and the reference frequency or correction rate at which this loop operates is made variable so that the larger correction rate is always a submultiple of the synthesizer output frequency.

A detailed preferred embodiment of the system is explained hereinafter with particular reference being made to the single figure in which the improved frequency synthesizer is shown.

Frequency synthesizer 10, as shown in the figure, has three phase locked loops A, B and C. Loop A is a normal state-of-the-art frequency synthesizer in which the output frequency is corrected at a relatively low rate. Loops B and C on the other hand correct the output frequency at a much faster rate than loop A and in fact, a much faster rate than the channel spacing of the synthesizer 10 output.

Loop A includes voltage controlled oscillator 12 which provides a signal $F_o$ on line 14 having a certain frequency which depends upon the magnitude of the voltages applied to oscillator 12 from lines 16 and 18. Line 14 is coupled through line 20 to a variable ÷N frequency dividing network 22 which may be a state-of-the-art programmable integrated circuit array digital frequency dividing network. Network 22 divides the frequency of signal $F_o$ by whatever divisor N is programmed therein at the time, so the output signal $F_n$ from network 22, which equals $F_o/N$, appears on line 24 and is applied to one input of phase comparing circuit 26. A reference signal $F_r$ appears on line 28 and is applied to the other input of circuit 26 and this signal is derived from reference oscillator 30 and fixed ÷R frequency dividing network 32. Oscillator 30 may be, for instance, a crystal oscillator oscillaing at a certain constant frequency and ÷R network 32 is a fixed digital dividing network. Thus $F_r$ is always constant. The frequency of reference oscillator 30 and divisor R of ÷R network 32 are chosen so that the frequency of $F_r$ is equal to the channel spacing of synthesizer 10, or a submultiple thereof.

Phase comparing circuit 26 compares the frequencies of signals $F_n$ and $F_r$ and changes the magnitude of the voltage appearing on line 34 if these two frequencies are not equal. The voltage on line 34 is applied through low pass filter 36 to line 16. Any change of the voltage of the signal on line 16 will cause VCO 12 to change frequency and oscillate at a higher or lower frequency depending on the sign of the voltage change on line 16. Once the VCO 12 reaches a particular frequency $F_o$ such that $F_o/N$ is equal to $F_r$, the voltage appearing on line 34 will remain constant. At this point loop A becomes phase locked and $F_o$ becomes the desired stable frequency.

Circuit 26, which is well known in the art, looks at the time of concurrence of each pulse in signals $F_n$ and $F_r$. When the two signals have the same frequency, the time, or phase difference, of an $F_n$ waveform and an $F_r$ waveform remains constant. If $F_n$ changes, this phase difference also changes and a D.C. voltage change dependent upon this phase change, is applied to line 34.

If a different stable frequency is desired, the divisor of ÷N network 22 is changed to a value corresponding to the desired new frequency. Thus signal $F_n$ is changed and no longer equals $F_r$, so the voltage on line 34 will be correspondingly changed. This changed voltage is applied through low pass filter 36 to line 16 and change the frequency of $F_o$ until $F_n$ again equals $F_r$. At this point a second stable output frequency $F_o$ is achieved.

As an example of the operation of loop A, assume that it is desirous to have VCO 12 operate in 100 Hz. intervals between 33 and 39 mHz. In this case the divisor of ÷N network 32 will be set between 330,000 and 390,000. If, for instance, frequency 36.4782 mHz. is desired, one sets the divisor of the ÷N network 22 to 364,782. When VCO 12 oscillates at 36.4782 mHz., $F_n$ will equal 100 Hz. Furthermore, assume that reference oscillator 30 oscillates at 1 mHz. and ÷R network 32 divides this by 10,000 so, therefore, $F_r$ will always equal 100 Hz. Thus any time that $F_o$ does not equal 36.4782 mHz., $F_n$ will not equal 100 Hz. and since $F_n$ will not equal $F_r$, the voltage on line 34 is corrected by an amount proportional to this frequency difference and the corrected voltage is applied through low pass filter 36 and line 16 and corrects VCO 12.

The major problem with loop A is that $F_o$ is only being corrected approximately once every 365,000 cycles. Therefore, considerable incidental FM can occur between these corrections due to the drifting of VCO 12 to frequencies above and below the desired stable frequency. Furthermore, the spectral purity of $F_o$ with only loop A operating is not good. To eliminate this incidental FM and poor spectral purity, it is necessary to increase the sampling rate of a phase comparator 26. However, if this is done with only the loop A in the system, it will not be possible to have the 100 Hz. channel spacing that is required because the sampling rate of phase comparator 26 determines the channel spacing.

In order to increase the correction rate of VCO 12 without correspondingly increasing the channel spacing of the stable output signals $F_o$, phase lock loops B and C are provided in system 10. In loop C the output signal $F_o$ of VCO 12 is applied through line 38 to variable ÷M frequency dividing network 40. The ÷M network 40 is the same type as ÷N network 22 with the divisor M of network 40 having the divisor N of network 22 with the last two digits truncated. In other words, when N is set at 364,782, M will be set at 3,647 so that M will change by 1 for every change of 100 by N. The output signal $F_m$ of ÷M network 40 is applied to line 42 and may vary in frequency between 10,000 and 10,002.7 Hz. for this particular setting of the ÷M. $F_m$ is applied as one input of phase comparator 44 which operates similar to phase comparator 26.

A voltage controlled crystal oscillator 46 (VCXO) applies a signal to line 48 having a certain frequency. This signal is frequency divided by fixed ÷L frequency dividing network 50 and applied as signal $F_L$ to line 52. $F_L$ is applied to the second input of phase comparator 44. Phase comparator 44 compares the frequency of signals $F_L$ and $F_m$ and applies a voltage to line 54, the magnitude of which is changed by an amount corresponding to the frequency difference between $F_L$ and $F_m$.

Line 54 is coupled through low pass filter 56 and line 58 to the control input of VCXO 46 and adjusts the frequency of the signal appearing on line 52 until $F_L$ is equal to a submultiple of the desired $F_o$. The output of phase comparator 44 is also applied through high pass filter 60 to line 18 which is the second controlled input to VCO 12. The signal on line 18 will correct the frequency of VCO 12 at the $F_L$ frequency rate. In the above example, this would be approximately 100 times greater than the channel spacing of VCO 12, so the spectral purity is increased by 100 and incidental FM is reduced to acceptable values.

In the operation of synthesizer 10, loop A will determine, depending on the value of N, the desired stable output frequency $F_o$, and will become phase locked thereat independent of loops B and C. Loops B and C operate together such that loop B becomes phase locked at the frequency of VCXO 46 and loop C becomes phase locked at the frequency of $F_o$. For loop B, signal $F_m$ will act as the reference frequency for phase comparator 44 so that VCXO 46 becomes locked at a frequency which is a submultiple of $F_o$ since $F_m$ is a submultiple of $F_o$. For loop C, $F_L$ acts as the reference frequency for comparator 44 and VCO 12 is corrected at this frequency rate. A small change in $F_o$ below the $F_L$ rate corrections due to, for instance, VCO drifting will not affect VCXO 46 because of the inclusion of low pass filter 56 in this loop. On the other hand during the time loop B is locking up and thereafter, the slowly varying D.C. voltage required to control VCXO 46 does not affect VCO 12 due to the presence of high pass filter 60 in loop C. Continuing with the example previously given for loop A, where it was desirous to obtain an output frequency of 36.4782 mHz. and where N was selected as 364,782, M will be selected as 3,647. Thus $F_m$ will be 36.4782 mHz., 3,647 or 10,002.2 Hz. Loop A locks up and maintains $F_o$ at the approximately correct frequency so that $F_m$ is therefore approximately correct. Loop B will become phase locked when $F_L$ is equal to the approximately correct $F_m$. By this time loop C is correcting VCO 12 at a rapid enough rate so that $F_m$ is essentially the required frequency for a stable $F_o$. Thereafter, VCXO 46 is automatically set so that $F_L$ is the required frequency. In this manner VCO 12 is corrected at a fixed rate 100 times the channel spacing so that the incidental $F_m$ is substantially removed from signal $F_o$ and the spectral purity is greatly enhanced, although the channel spacing of synthesizer 10 has not been increased.

What is claimed is:

1. A digital frequency synthesizer for providing an output signal having an output frequency which approaches a selected one of a plurality of desired stable frequencies, said synthesizer comprising, oscillating means for providing said output signal at an output thereof, said output frequency being determined by respective first and second control signals applied to respective first and second inputs thereof, variable frequency determining means to which said output signal is applied for applying said first control signal to said first input of said oscillating means in accordance with the then one selected desired frequency, said frequency determining means further operating to correct said first control signal at a first rate with said correction being proportional to the amount said output frequency deviates from said one selected desired frequency at the time of said correction, said first rate of correction determining the frequency difference between adjacent ones of said desired stable frequencies, and frequency correcting means to which said output signal is applied for applying said second control signal to said second input of said oscillating means in accordance with the then one selected desired frequency, said frequency correcting means operating to correct said second control signal at a second rate with said correction being proportional to the amount said output frequency deviates from said one selected desired frequency at the time of said correction, said second rate of correction being a submultiple of said one selected desired frequency and greater than said frequency difference between adjacent ones of said stable frequencies.

2. The invention according to claim 1, wherein said first rate is equal to said frequency difference between adjacent ones of said stable frequencies.

3. The invention according to claim 1, wherein said second rate changes when said one stable selected desired frequency is changed to the next stable selected frequency.

4. A digital frequency synthesizer for producing an output signal having an output frequency which approaches a selected one of a plurality of desired stable frequencies, said one stable frequency having a fixed frequency difference from the stable frequencies immediately adjacent thereto, said synthesizer comprising, first controlled oscillating means for producing said output signal at an output thereof, said output frequency being under the control of one parameter of each of first and second control signals applied to respective first and second inputs thereof, said control signals selecting said one stable frequency and maintaining said output frequency such that the deviation from said one stable frequency is minimized, a fixed oscillating means for providing to an output thereof a first reference signal having a first reference frequency, a first dividing network having one of a plurality of available divisors and to which said output signal is applied for providing at an output thereof a first divided signal having a first divided frequency which is a submultiple of said output frequency and which is not greater than said fixed frequency difference when said output frequency equals said one selected stable frequency, said divisor of said first dividing network determining said one selected stable frequency, a first phase comparing circuit having a first input coupled to said output of said first dividing network and a second input coupled to said output of said fixed oscillating means for providing said first control signal at an output thereof, said first control signal having a parameter which is corrected at said first reference frequency rate in accordance with the then existing frequency difference between said first reference frequency and said first divided frequency, first coupling means for applying said first control signal to said first input of said first controlled oscillating means, a second dividing network having one of a plurality of available divisors, each one of which is associated with at least two of said divisors of said first dividing network, and to which said output signal is applied for providing at an output thereof a second divided signal having a second divided frequency which is a submultiple of said output frequency, a second phase comparing circuit having a first input coupled to said output of said second dividing network, and a second input to which is applied a second reference signal having a then existing second reference frequency which is different for each of said divisors of said first divided network associated with any one of said divisor of said second dividing network, for providing said second control signal at an output thereof, said second control signal having a parameter which is corrected at said second reference frequency rate in accordance with the then existing difference between said second reference frequency and said second divided frequency, second coupling means for applying said second control signal to said second input of said first controlled oscillating means, means coupled to said output of said second phase comparing circuit and responsive to said second control signal for providing said second reference signal at an output thereof, said then existing second reference frequency being in accordance with the then existing parameter of said second control signal, and means for applying said second reference signal to said second input of said second phase comparing circuit.

5. The invention according to claim 4, wherein said parameter of said first and second control signals is the magnitudes thereof, and wherein said parameter of said second control signal has a direct current and an alternating current component.

6. The invention according to claim 5, wherein said means for producing said second reference signal includes, a second controlled oscillating means responsive to said direct current component of said second control signal, said second controlled oscillating means producing said second reference signal in accordance with the then existing direct current component of said magnitude of said second control signal, and third coupling means for coupling said output of said second phase comparing circuit to said input of said second controlled oscillating means.

7. The invention according to claim 6 wherein said third coupling means is a low pass filter.

8. The invention according to claim 5 wherein said second coupling means is a high pass filter.

9. The invention according to claim 5 wherein said first coupling means is a low pass filter.

10. The invention according to claim 5 wherein said first reference frequency equals said fixed frequency difference.

No references cited.

JOHN KOMINSKI, Primary Examiner

U.S. Cl. X.R.

331—11